(12) United States Patent
Viard et al.

(10) Patent No.: US 9,476,746 B2
(45) Date of Patent: Oct. 25, 2016

(54) MINIATURIZED SENSOR COMPRISING A HEATING ELEMENT, AND ASSOCIATED PRODUCTION METHOD

(75) Inventors: Romain Viard, Lille (FR); Abdelkrim Talbi, La Madeleine (FR); Philippe Jacques Pernod, Lille (FR); Alain Merlen, Lille (FR); Vladimir Preobrazhensky, Villeneuve d'Ascq (FR)

(73) Assignees: Centre National de la Recherche Scientifique, Paris (FR); Ecole Centrale de Lille, Villeneuve d'Ascq (FR)

( * ) Notice: Subject to any disclaimer, the term of this patent is extended or adjusted under 35 U.S.C. 154(b) by 235 days.

(21) Appl. No.: 14/232,040

(22) PCT Filed: Jul. 12, 2012

(86) PCT No.: PCT/IB2012/053578
§ 371 (c)(1),
(2), (4) Date: Jan. 23, 2014

(87) PCT Pub. No.: WO2013/008203
PCT Pub. Date: Jan. 17, 2013

(65) Prior Publication Data
US 2014/0157887 A1    Jun. 12, 2014

(30) Foreign Application Priority Data

Jul. 13, 2011 (FR) ..................................... 11 56409

(51) Int. Cl.
*G01F 1/688* (2006.01)
*B81B 3/00* (2006.01)
(Continued)

(52) U.S. Cl.
CPC ............. *G01F 1/688* (2013.01); *B81B 3/0081* (2013.01); *G01F 1/6845* (2013.01); *G01F 1/6882* (2013.01); *G01L 21/12* (2013.01); *H01L 41/316* (2013.01); *H01L 41/332* (2013.01);
(Continued)

(58) Field of Classification Search
CPC ........ G01F 1/6845; G01F 1/688; G01F 1/69; G01F 1/692; B81B 2203/0109; H01L 41/316; H01L 41/332
USPC ....................................................... 73/204.17
See application file for complete search history.

(56) References Cited

U.S. PATENT DOCUMENTS 4,317,102 A * 2/1982 Vranas ..................... G01P 5/12
29/613
4,594,889 A * 6/1986 McCarthy ............. G01F 1/6845
73/204.26
(Continued)

OTHER PUBLICATIONS

Liu, C., et al.; "A Micromachined Flow Shear-Stress Sensor Based on Thermal Transfer Principles;" Journal of Microelectromechincal Systems, vol. 8, No. 1; pp. 90-99; dated Mar. 1999.
(Continued)

*Primary Examiner* — Freddie Kirkland, III
(74) *Attorney, Agent, or Firm* — Alston & Bird LLP (57) ABSTRACT

The invention relates to a miniaturized sensor having a heating element, and to an associated production method. The sensor includes a substrate, a cavity and a heat-insulating structure suspended above the cavity by areas connecting to the substrate. The heat-insulating structure includes at least two bridges extending above the cavity, the heating element being supported by said bridges, extending transversely thereto.

23 Claims, 7 Drawing Sheets

(51) Int. Cl.
*G01F 1/684* (2006.01)
*G01L 21/12* (2006.01)
*H01L 41/316* (2013.01)
*H01L 41/332* (2013.01)

(52) U.S. Cl.
CPC *B81B2201/0264* (2013.01); *B81B 2201/0292* (2013.01); *B81B 2203/0109* (2013.01)

(56) References Cited

U.S. PATENT DOCUMENTS

| | | | | |
|---|---|---|---|---|
| 4,744,246 A * | 5/1988 | Busta | | H01L 29/66992 257/E29.347 |
| 4,783,996 A * | 11/1988 | Ohta | | G01P 5/12 73/204.17 |
| 5,201,221 A * | 4/1993 | Forgacs | | G01P 5/12 73/204.26 |
| 5,310,449 A * | 5/1994 | Henderson | | G01F 1/6845 438/382 |
| 5,313,832 A * | 5/1994 | Stephan | | G01F 1/6845 73/204.26 |
| 5,883,310 A * | 3/1999 | Ho | | G01P 5/12 73/720 |
| 6,393,907 B1 * | 5/2002 | Yamakawa | | G01F 1/684 73/204.26 |
| 6,470,743 B2 * | 10/2002 | Yonezawa | | G01F 1/692 73/204.26 |
| 6,923,054 B2 * | 8/2005 | Liu | | G01F 1/6845 73/204.27 |
| 7,892,488 B2 * | 2/2011 | Speldrich | | G01F 1/6845 422/420 |
| 8,166,814 B2 * | 5/2012 | Ike | | G01F 1/6845 29/620 |
| 8,881,601 B2 * | 11/2014 | Lammerink | | G01F 1/6845 73/861.01 |
| 8,978,462 B2 * | 3/2015 | Pernod | | G01F 1/6845 216/13 |
| 2009/0158838 A1 * | 6/2009 | Speldrich | | G01F 15/006 73/272 R |

OTHER PUBLICATIONS

Meunier, D., et al.; "*Realization and simulation of wall shear stress integrated sensors;*" Microelectronics Journals, vol. 34; pp. 1129-1136; dated 2003.

Wang, S. N., et al.; "*Thermal micropressure sensor for pressure monitoring in a minute package;*" Journal of Vacuum Science and Technology, Part 1, vol. 19, No. 1; pp. 353-357; dated Jan. 2001.

International Search Report and Written Opinion for Application No. PCT/IB2012/053578; dated Jan. 10, 2013.

* cited by examiner

MINIATURIZED SENSOR COMPRISING A HEATING ELEMENT, AND ASSOCIATED PRODUCTION METHOD

FIELD

The present invention relates to the field of miniaturized sensors with heater elements.

BACKGROUND

The term "miniaturized sensor" is used to mean a sensor that presents at least one dimension lying in the range a few micrometers to a few hundreds of micrometers.

Such sensors may be used for measuring a flow speed of a fluid, wall shear friction, or indeed a pressure.

A miniaturized heater element sensor is described for example in the article by Meunier et al., "Realization and simulation of wall shear stress integrated sensors", Microelectronics Journal 34 (2003), pp. 1129-1136, for measuring the wall shear stress associated with a fluid flow.

That sensor comprises a substrate, a thermally insulating structure, a heater element (hot wire), and electrical contacts. The thermally insulating structure makes it possible to define a cavity over which the hot wire extends, the hot wire being held on the thermally insulating structure via its ends. The electrical contacts are arranged on the thermally insulating structure and they are connected to the ends of the hot wire, so that the hot wire can be electrically powered to perform heating by the Joule effect.

Several parameters are involved in the quality of the measurement taken with a sensor of that type.

Firstly, it is necessary to consider the shape of the hot wire.

It is preferable for the hot wire to present the greatest possible length $L_{wire}$ with a hydraulic diameter $d_h$ that is as small as possible. The hydraulic diameter $d_h$ is defined by the relationship:

$$d_h = 4S/P$$

where S is the section of the hot wire and P is its wetted perimeter.

A small hydraulic diameter for the hot wire limits the thermal inertia of the wire and thus improves the bandwidth of the sensor.

Furthermore, in practice, the person skilled in the art considers that it is preferable to dimension the wire so that $L_{wire}/d_h > 30$, in order to obtain a sensor that is sufficiently sensitive. This relationship is satisfied by the sensor proposed by Meunier et al.

The shape of the hot wire thus has an influence on the sensitivity of the sensor and on its bandwidth.

It is then also necessary to consider the nature of the materials used for making the wire.

The natures of the materials that are selected has an effect on the temperature coefficient of resistance (TCR) of the wire and consequently on the sensitivity of the sensor.

Furthermore, the natures of the materials selected for the wire define the thermal conductivity of the wire, which needs to be as high as possible in order to improve the bandwidth of the sensor.

In the article by Meunier et al., a hot wire is selected for this purpose that is made of boron-doped polysilicon.

Finally, in order to avoid interfering heat losses, which also have an influence on the bandwidth of the sensor, it is appropriate to insulate the hot wire thermally from the substrate as much as possible.

For this purpose, the hot wire of the sensor proposed by Meunier et al. extends over a cavity containing air, which by its nature is a poor conductor of heat.

Also for this purpose, a thermally insulating structure is used between the ends of the hot wire and the substrate. Specifically, the thermally insulating structure is made of silicon nitride since, like air, that material presents low thermal conductivity.

The sensor proposed by Meunier et al. is relatively simple in design and presents sensitivity that is sufficient for measuring wall shear friction.

Nevertheless, that type of sensor can be difficult to use for measurements other than those concerning measuring wall shear friction or measurements of low flow speed.

The hot wire is fragile and it is difficult to use for measuring speeds typically exceeding 20 meters per second (m/s), since otherwise it risks breaking. This fragility is associated with the fact that the hydraulic diameter $d_h$ of the wire is small, its ratio $L_{wire}/d_h$ is high, and it is suspended over the cavity.

Numerous heater element sensors of different designs have been proposed.

The sensor proposed by Chiang Lu et al., "A micromachined flow shear-stress sensor based on thermal transfer principles", Journal of Microelectromechanical Systems, Vol. 8 (1), pp. 90 to 99, is particularly advantageous.

That sensor comprises a substrate having a cavity, a thermally insulating structure suspended over the cavity by means of connection zones connecting it with the substrate, and a heater element (hot wire) arranged on the thermally insulating structure.

In that design, the thermally insulating structure is in the form of a diaphragm suspended over a cavity made in the substrate.

The hot wire satisfies the relationship $L_{wire}/d_h > 30$, and it is made of phosphorus-doped polysilicon. The characteristics of the wire (shape, TCR, thermal conductivity, . . . ) are thus close to the characteristics of the hot wire used in the sensor proposed by Meunier et al.

Furthermore, the thermally insulating structure used by Chiang Lu et al. presents thermal conductivity identical to the thermally insulating structure of the Meunier et al. sensor, insofar as it is likewise made of silicon nitride.

The sensitivity of that sensor should be comparable to that of the sensor proposed by Meunier et al.

Nevertheless, that sensor differs from the sensor proposed by Meunier et al. mainly in the shape of the thermally insulating structure (diaphragm), which enables the cavity made in the substrate to be covered so that it can contain a high vacuum.

Insofar as the hot wire is supported by the diaphragm, it can be understood that the sensor is more robust than the sensor proposed by Meunier et al. The robustness of that sensor is also improved by the greater thickness of the hot wire (0.45 micrometers (μm) for Chiang Lu et al. as compared with 0.3 μm for Meunier et al.).

It is therefore possible to envisage using the sensor structure proposed by Chiang Lu et al. to perform measurements of flow speeds that are higher than can be measured with the sensor proposed by Meunier et al. The article by Chiang Lu et al. also specifies that their sensor has been tested at speeds of 25 m/s.

In contrast, that sensor gives a bandwidth comparable to that of the bandwidth of the sensor proposed by Meunier et al., in spite of using a cavity under a high vacuum under the thermally insulating diaphragm, the cavity limiting exchanges of heat between the diaphragm and the cavity.

The authors specify that the cutoff frequency of their sensor is 1.9 kilohertz (kHz) (at constant current), whereas the cutoff frequency of the sensor proposed by Meunier et al. is about 2 kHz (at constant current).

This is probably explained by the heat losses associated with conduction in the diaphragm and by the greater thickness of the hot wire. Using a high vacuum under the diaphragm thus appears to do more than compensate for the drawbacks in terms of bandwidth that are associated with using a thermally insulating diaphragm and a greater thickness for the hot wire.

SUMMARY

An object of the invention is to propose a miniaturized sensor that is simultaneously sensitive and robust and that has bandwidth that is improved compared with known sensors.

To achieve this object, the invention proposes a miniaturized sensor having a heater element and comprising a substrate, a cavity, and a thermally insulating structure suspended over the cavity by means of connection zones connecting it with the substrate, the sensor being characterized in that the thermally insulating structure comprises at least two bridges extending over the cavity between its two connection zones with the substrate, the heater element being supported by the bridges by extending transversely relative to the bridges.

The device, may have other technical characteristics taken singly or in combination:
- the length L of a bridge lies in the range 10 µm to 80 µm;
- the width l of a bridge lies in the range 5 µm to 10 µm;
- the distance D between two bridges lies in the range 20 µm to 40 µm;
- the thickness e of the thermally insulating structure, and in particular of the bridges lies in the range 100 nanometers (nm) to 500 nm;
- the height h of the cavity lies in the range 50 nm to 500 µm;
- the width a of the heater element lies in the range 1 µm to 5 µm;
- the thickness b of the heater element lies in the range 50 nm to 500 nm;
- the heater element comprises a plurality of layers of electrically conductive material, one layer being made of a material presenting residual stress in tension and the adjacent layer being made of a material presenting residual stress in compression, the thicknesses of these layers being adapted to compensate for the residual stresses among the various layers in order to obtain a total residual stress for the heater element that is less than a first limit value, e.g. 250 megapascals (MPa);
- the heater element comprises:
  - a first layer of platinum;
  - at least one bilayer made up of a layer of nickel coated in a layer of tungsten; and
  - a second layer of platinum;
- the thermally insulating structure comprises a plurality of layers of thermally insulating material, one layer being made of a thermally insulating material that presents residual stress in tension and the adjacent layer being made of a thermally insulating material that presents residual stress in compression, the thicknesses of the layers of thermally insulating material being adapted to compensate for the residual stresses among the various layers so as to obtain a total residual stress for the structure that is less than a second limit value, e.g. 250 MPa;
- the thermally insulating structure comprises at least one bilayer formed by a layer of silicon dioxide and a layer of silicon nitride;
- the thermally insulating structure includes a strip extending under the heater element between the two bridges, said thermally insulating strip incorporating a ribbon made of an electrically conductive material, the ribbon being electrically insulated from the heater element by said strip;
- the thermally insulating structure includes two strips extending under the heater element between the two bridges, two ribbons made of electrically conductive material and separated by a strip of air being deposited between the two strips of the thermally insulating structure, such that the ribbons are electrically insulated from the heater element;
- the thermally insulating structure includes at least two other thermally insulating strips extending between the two bridges on either side of the heater element, each of these two other strips including a ribbon made of an electrically conductive material;
- the thermally insulating structure is made of a piezoelectric material deposited on thermal insulation and including transducers for surface acoustic waves;
- the substrate is made of a piezoelectric material, and a surface acoustic wave resonator is deposited on the substrate, at the bottom of the cavity;
- a plate of piezoelectric material is provided on the bottom of the cavity, said plate being provided on its surface with a surface acoustic wave resonator; and
- the thermally insulating structure has N bridges on which the heater element is deposited, where N is greater than or equal to three.

To achieve this object, the invention also proposes a method of fabricating a sensor according to any preceding claim, characterized in that it comprises the following steps:

a) depositing at least one layer of thermally insulating material on a substrate;

b) depositing at least one element made of an electrically conductive material on said at least one layer of thermally insulating material;

c) subjecting the structure obtained in step b) to plasma etching in order to define the shape of the thermally insulating structure with at least two bridges extending between two connection zones connecting said thermally insulating structure with the substrate; and d) performing gaseous chemical etching to define the cavity of the substrate over which the thermally insulating structure extends.

The invention may also comprise one or more of the following characteristics taken singly or in combination:
- prior to step a), there is provided a step of locally depositing a top layer on the substrate followed by a step of depositing a sacrificial layer of predetermined thickness on the top layer;
- step b) consists in depositing a plurality of electrically conductive material layers in succession, one layer being made of a material presenting residual stress in tension and the adjacent layer being made of a material presenting residual stress in compression, the thicknesses of these layers of insulating material being adapted to compensate the residual stresses among the various layers in order to obtain a total residual stress for the element that is less than a first limit value, e.g. 250 MPa; and step a) consists in depositing a plurality of layers of thermally insulating material in succession, one layer being made of a material presenting residual stress in tension and the adjacent layer being made of a material presenting residual stress in compression, the thickness of these layers of insulating material being adapted to compensate the residual stresses among the various layers so as to obtain a total residual stress for the thermally insulating structure that is less than a second limit value, e.g. 250 MPa.

BRIEF DESCRIPTION OF THE DRAWINGS

Other characteristics, objects, and advantages of the invention are specified in the following detailed description made with reference to the following figures:

FIGS. 16(a) to 16(e) show various intermediate structures obtained when fabricating a pair of sensors in accordance with the invention.

DETAILED DESCRIPTION

Figure 1:
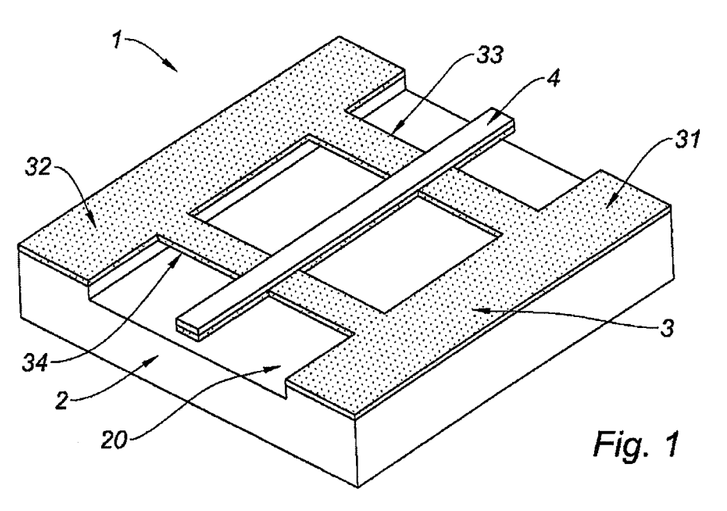
FIG. 1 shows a sensor in accordance with the invention, in a perspective view.
Figure 2:
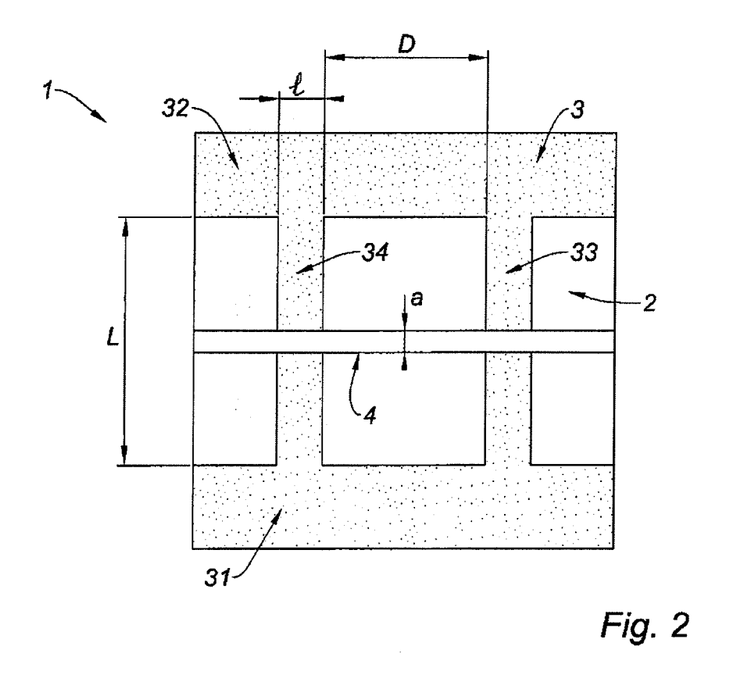
FIG. 2 shows the FIG. 1 sensor in a plan view.
Figure 3:
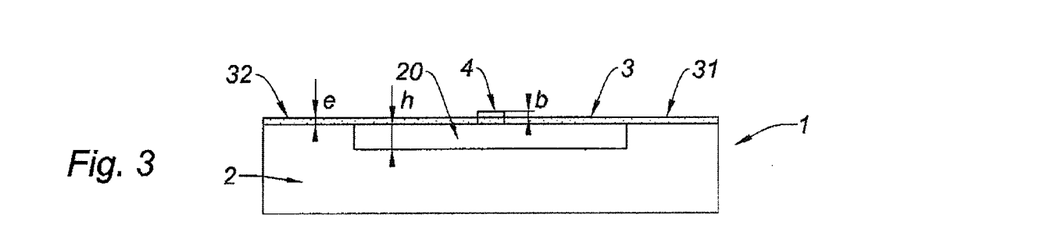
FIG. 3 shows the FIG. 1 sensor in a side view.

The heater element sensor 1 of the invention comprises a substrate 2, a cavity 20 specifically formed in the substrate 2, and a thermally insulating structure suspended over the cavity 20 via link zones 31, 32 linking with the substrate 2.

The thermally insulating structure 3 has at least two bridges 33, 34 extending over the cavity 20, transversely relative to the link zones 31, 32 of the thermally insulating structure 3 with the substrate 2. The heater element 4 is also supported by the bridges 33, 34 and it extends transversely relative to the bridges.

Furthermore, the ends of the heater element are connected to electrical contacts (not shown). Electric current can thus flow through the heater element 4 in order to enable it to perform heating by the Joule effect.

The width a of the heater element 4 lies in the range 1 µm to 5 µm. The thickness b of the heater element 4 lies in the range 50 nm to 500 nm. The length $L_{wire}$ of the heater element 4 is equal to 2(D+l) given the configuration shown in FIG. 1: it lies in the range 50 µm to 100 µm.

The dimensions of the heater element 4 thus lie well within the relationship $L_{wire}/d_h > 30$, with this factor being even greater than 50.

The sensor 1 thus presents great sensitivity.

Furthermore, the bridges 33, 34 of the thermally insulating structure 3 confer great robustness to the sensor by acting as supports for the heater element 4.

The robustness of the sensor may be adjusted as a function of the intended application, by selecting the geometrical parameters characteristic of each of these bridges, namely its length L, its width l, its thickness e, and the distance D between the two bridges 33, 34.

Thus, the length L of a bridge 33, 34 may lie in the range 10 µm to 80 µm. The width l of a bridge 33, 34 may lie in the range 5 µm to 10 µm. The thickness e of a bridge 33, 34 may lie in the range 100 nm to 500 nm. The distance D between the two bridges 33, 34 may lie in the range 20 µm to 40 µm.

It should be observed that the thickness e of the bridges 33, 34 corresponds more generally to the thickness of the thermally insulating structure 3.

In addition, the shape of the thermally insulating structure 4 imparts great freedom of choice in how it is dimensioned in order to accommodate the contradictory constraints associated with obtaining a sensor that is simultaneously robust and sensitive and that presents a large bandwidth (low thermal losses, short response time).

The ratios L/l, D/l, and D/a that are selected are the result of a compromise between the effectiveness of the thermal insulation of the heater element 4 and the robustness of the sensor 1. The higher these ratios, the more the thermal insulation of the heater element 4 is effective, but also the more the sensor 1 is fragile.

Furthermore, the parameters a, b, and e that are selected is a result of a compromise between the robustness of the sensor 1 and its thermal inertia, where thermal inertia has an influence on the bandwidth of the sensor 1. The smaller the values of these parameters, the shorter the response time of the sensor 1 (i.e. the wider the bandwidth), but the sensor 1 is more fragile.

The designs proposed in the state of the art do not provide this freedom of choice, which makes it possible to satisfy the technical problem posed by the invention.

The heater element 4 may be made of a metal material or of a doped semiconductor material such as polysilicon, diamond, or silicon carbide (SiC).

When a metal material is used, the heater element 4 may comprise at least one of the following metals: Ag, Ti, Cr, Al, Cu, Au, Ni, W, or Pt.

Advantageously, the heater element 4 comprises a plurality of layers of electrically conductive material, one layer being made of a material presenting residual stress in tension and the adjacent layer being made of a material presenting residual stress in compression, the thicknesses of these layers being adapted so as to compensate the residual stresses among the various layers in order to obtain total residual stress for the heater element 4 that is less than a limit value.

These layers are advantageously made by successively evaporating layers of different materials through a resin mask presenting a "cap" profile, this mask making it possible to obtain localized deposition.

It is nevertheless also possible to perform deposition by sputtering.

This makes it possible to obtain a heater element 4 that is thick enough to ensure that it is robust, while avoiding any bending that would be harmful to the quality of the measurement taken by the sensor 1.

The limit value is a value beyond which the heater element 4 must not go. This limit value may be 250 MPa, and it is preferably 200 MPa.

By way of example, the heater element 4 may comprise at least one layer of nickel coated in at least one layer of tungsten, the thicknesses of these layers being adapted to obtain total residual stress below the limit value.

The heater element 4 could comprise a first layer of platinum, at least one bilayer made up of a layer of nickel (Ni) coated in a layer of tungsten (W), and a second layer of platinum. The platinum serves to prevent the other metals oxidizing.

These deposits may be made by cathode sputtering. This technique uses a plasma of inert gas, such as argon, for sputtering the material that is to be deposited (Ni or W) onto a target. The argon pressure used lies in the range 0.9 pascals (Pa) to 3.1 Pa, which corresponds to respective argon flow rate lying in the range 25 standard cubic centimeters per minute (sccm) to 110 sccm.

The plasma is created between the target (negatively biased) and the substrate (positively biased), and as a result the atoms torn from the target are directed towards the substrate. The plasma is densified and concentrated with the help of the magnetic field generated by a magnetron for the purpose of increasing the deposition rate. The radio frequency (RF) power selected for the magnetron is 300 watts (W).

For inert gas pressure lying in the range 1.2 Pa to 3.1 Pa, the Applicant has observed that the residual tension in the nickel varies in insignificant manner and presents an absolute value of about 550 MPa. Furthermore, in the inert gas pressure range 0.9 Pa to 3.1 Pa, the Applicant has observed that the residual compression in tungsten varies in insignificant manner and presents an absolute value of about 1250 MPa.

To compensate for the residual stresses in the nickel layer by means of the residual stresses in the tungsten layer, it can therefore be seen that the thickness of the nickel layer needs to be greater than the thickness of the tungsten layer, at a ratio of about 2.2.

When it is desired to provide a heater element having a thickness of 100 nm, it is thus possible to make a 10 nm layer of platinum, a 55 nm layer of nickel, a 25 nm layer of tungsten, and finally a 10 nm layer of platinum. Under such conditions, the layers of nickel and tungsten are compensated in stress.

The thermally insulating structure 3 may be made out of silicon nitride ($Si_3N_4$) or out of silicon dioxide ($SiO_2$).

Advantageously, the thermally insulating structure comprises a plurality of layers of thermally insulating material, one layer being made of a thermally insulating material and presenting residual stress in tension and the adjacent layer being made of a thermally insulating material and presenting residual stress in compression, the thicknesses of these layers of thermally insulating material being adapted to compensate for the residual stresses among the various layers so as to obtain a total residual stress in the structure that is less than another limit value.

The limit value may be 250 MPa.

Furthermore, each layer is made by plasma enhanced chemical vapor deposition (PECVD) or by low pressure chemical vapor deposition (LPCVD).

This makes it possible to obtain a thermally insulating structure that is relatively thick, in order to improve its robustness, while ensuring that the residual stresses in the materials do not lead to the structure bending. The thermally insulating structure 3 can thus remain perfectly straight, which is important for the bridges 33, 34.

For example, the thermally insulating structure 3 may have at least one bilayer made up of a layer of silicon dioxide and a layer of silicon nitride, of thicknesses selected so as to obtain a total residual stress that is less than the second limit value.

A method of fabricating the sensor shown in FIGS. 1 to 3 is described below with reference to FIGS. 4($a$) to 4($d$).

Step a) consists in depositing a layer of thermally insulating structure 3 on the substrate 2, cf. FIG. 4($a$).

Step b) consists in depositing the heater element 4, which is made of an electrically conductive material, on the layer of thermally insulating structure, cf. FIG. 4($b$).

Thereafter, during a step c), the structure obtained in step b) is etched under plasma in order to define the bridges 33, 34 of the thermally insulating structure 3, cf. FIG. 4($c$).

Figure 4A:
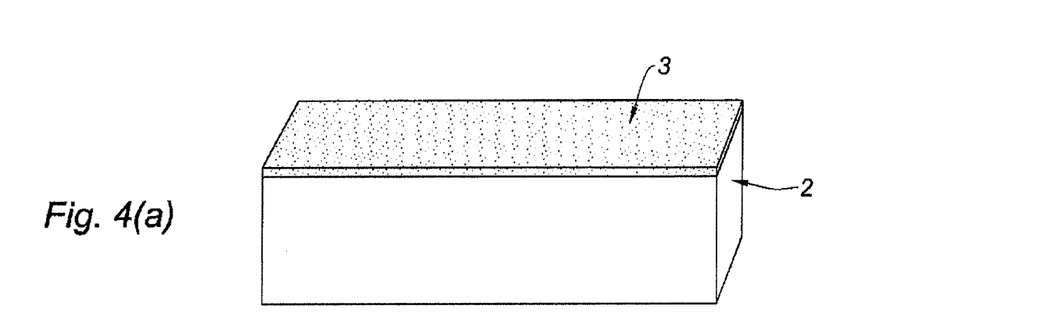
FIGS. 4(a) to 4(d) show different intermediate structures obtained while fabricating the sensor shown in FIGS. 1 to 3.
Figure 4B:
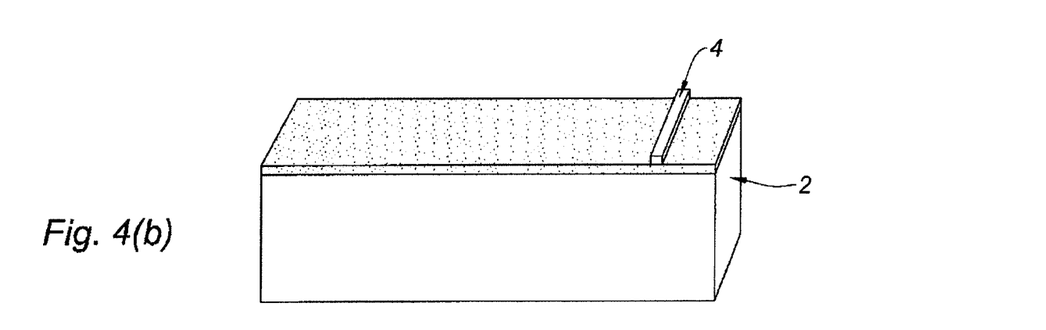
Figure 4C:
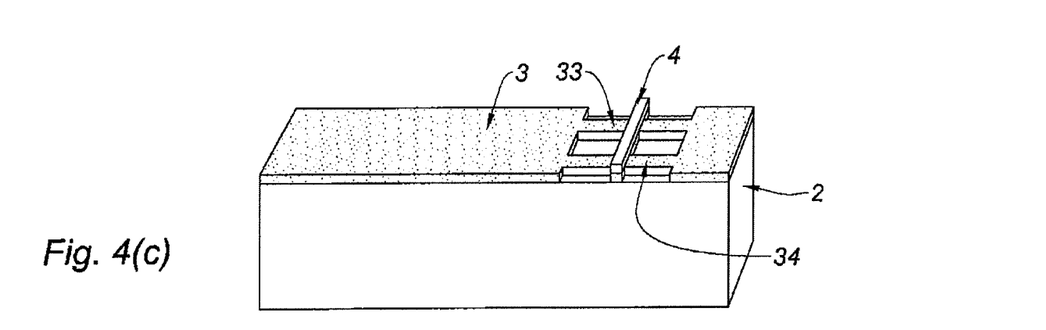

This etching may be performed using $CHF_3/CF_4$. It is anisotropic etching, specifically vertical etching, enabling the thermally insulating structure 3 to be etched down to the substrate 2, which substrate is generally made of silicon. To perform this etching, it is possible to use the following plasma parameters: power 180 W, pressure 100 millitorr (mTorr), and finally a flow rate of 20 sccm for each of the two gases $CHF_3$ and $CF_4$.

Finally, during a step d), gaseous chemical etching is performed to define the cavity 20, specifically in the substrate, with the bridges 33, 34 of the thermally insulating structure 3 extending over this cavity 20, cf. FIG. 4($d$).

Figure 4D:
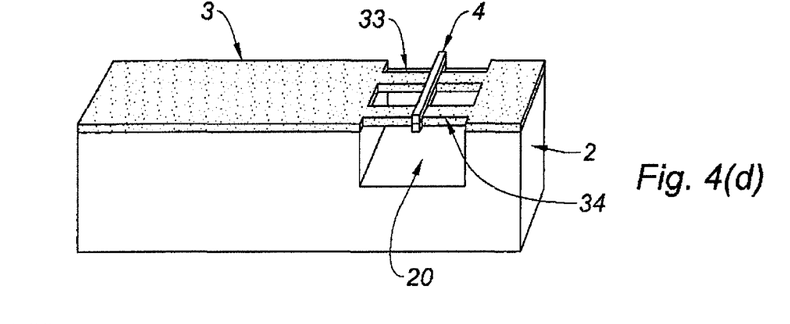

This etching may be performed using $XeF_2$, e.g. at a pressure of 5 Torr. Etching may also be performed using $SF_6/O_2$, e.g. with the following plasma parameters: power 180 W, pressure 100 mTorr, flow rate of 20 sccm for $SF_6$, and flow rate of 5 sccm for $O_2$, so as to obtain isotropic etching. This etching is performed in the substrate so as to release the bridges 33, 34 from the thermally insulating structure.

Electrical contacts are then made on the thermally insulating structure 3 at the ends of the heater element 4. This step is not shown.

In this method, the thermally insulating structure 3 also has a strip 35 under the heater element 4, between the two bridges 33, 34. This gives extra robustness to the sensor 1 shown in FIGS. 1 to 3.

Figure 5:
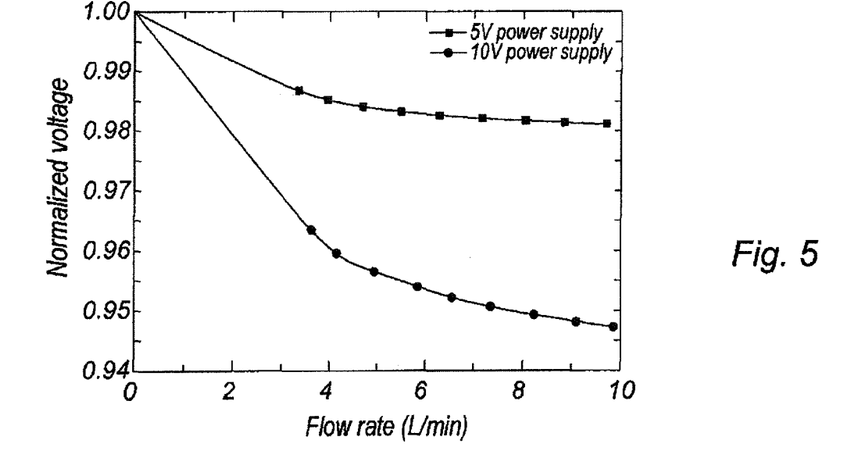
FIG. 5 shows how the normalized voltage across the terminals of a Wheatstone bridge connected to the heater element of the sensor shown in FIGS. 1 to 3 varies as a function of the rate of fluid flow through the cavity of the sensor.

FIG. 5 shows characterization of the sensor 1 shown in FIGS. 1 to 3.

This figure shows how the normalized flow rate and the speed in the microchannel formed by the cavity 20 vary as a function of time for a jet of air passed into the cavity at a frequency of 200 hertz (Hz).

Specifically, the cavity 20 presents a section:

$$L \times h = 40~\mu m \times 5~\mu m$$

The heater element 4 is made of platinum, having a TCR that is about 2400 parts per million per degree Celsius (ppm/° C.).

The thermally insulating structure is an $SiO_2/Si_3N_4/SiO_2/Si_3N_4/SiO_2$ multilayer structure with the layers having respective thicknesses of the order of 100 nm/20 nm/100 nm/20 nm/100 nm. The width l of a bridge 33, 34 is 10 μm and the distance D between the two bridges is 20 μm.

This figure also shows the same variation for a commercial sensor, constituted by a 1.5 millimeter (mm) Dantec hot wire (ref.: 9055P0111).

A good match can be seen between the measurements performed using the sensor 1 of the invention and those performed using the commercial sensor.

Furthermore, the sensitivity of the sensor 1 of the invention was measured as being 70 millivolts (mV) per liter per minute (L/min) to the power 0.32 (70 mV/(L/min)$^{0.32}$) for a power consumption of 20 milliwatts (mW).

This sensitivity expresses the variation in the voltage measured across the terminals of a Wheatstone bridge connected to the terminals of the heater element 4 as a function of the value of the flow rate in the cavity 20. Insofar as the heater element 4 conveys a current that is constant, the variation in the voltage across the terminals of the Wheatstone bridge represents variation in temperature and consequently in the electrical resistance of the heater element 4, as a function of the value of the flow rate in the cavity.

The Wheatstone bridge makes it easier to measure the temperature variation of the heater element 4 by eliminating the DC component of the resistance of the element 4.

This sensitivity is excellent.

Furthermore, the sensor 1 as tested in that way presents a cutoff frequency of about 5 kHz, at constant current.

It can also be used for measuring high speeds, going well above 20 m/s, and even above 100 m/s.

The sensor 1 shown in FIGS. 1 to 3 makes it possible in particular to measure speed and wall shear friction. This sensor may also be used for measuring pressure in the pressure range 0.1 Pa to $10^4$ Pa.

The sensor may also be adapted to measure higher pressures, typically going up to $10^6$ Pa.

By making a cavity 20 of low height, specifically lying in the range 50 nm to 500 nm, it is possible to use the sensor as a sensor 1' using the Pirani effect, for pressures having the same order of magnitude as atmospheric pressure (0.1 bar to 10 bar).

Figure 6:
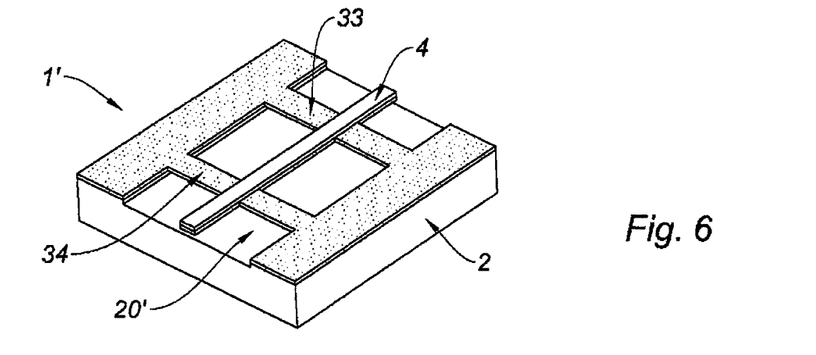
FIG. 6 is a perspective view showing a variant embodiment of the sensor in accordance with the invention, suitable for measuring pressure by the Pirani effect.

This variant embodiment is shown in FIG. 6. In FIG. 6, the height of the cavity 20 is lower than the height of the cavity 20 shown in FIG. 1.

Figure 7:
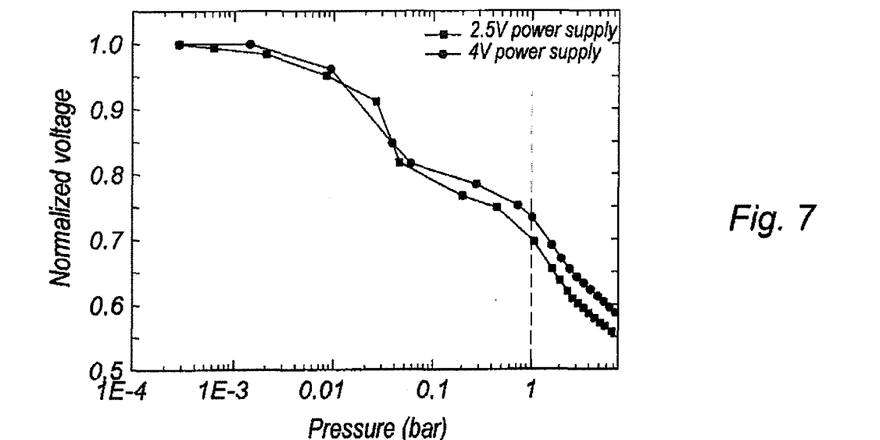
FIG. 7 shows how the normalized voltage cross the terminals of a Wheatstone bridge connected to the heater element of the sensor shown in FIG. 6 varies as a function of the pressure that exists in the cavity of the sensor.

FIG. 7 shows variation in the normalized voltage across the terminals of the Wheatstone bridge as a function of the pressure in the cavity, which cavity presents a section:

$$L \times h = 40~\mu m \times 300~nm$$

The other characteristics of the sensor 1' are the same as those of the sensor 1 used for the test of FIG. 5.

The characteristics of the sensor were measured in a pressurized chamber, the sensor being subjected to no flow. The measurement was therefore conductive.

FIG. 7 shows that the Pirani effect sensor can be used effectively in the range 10 Pa to $10^6$ Pa. In addition, the sensitivity of the sensor is about 1 mV per decade at pressure about 1 bar, while consuming power of 10 mW.

When the sensor is used as a pressure sensor, it also makes it possible to obtain a pressure sensor that is robust, i.e. that is capable of withstanding high pressures, that is sensitive, and that offers a large bandwidth.

It is thus shown that the sensor 1, 1' of the invention can be used for performing numerous measurements, namely speed measurements at high speeds (>100 m/s may be envisaged) or at lower speeds, wall shear friction measurements, and likewise pressure measurements satisfying requirements for robustness and sensitivity, and also the requirements for enlarging the bandwidth compared with known sensors.

The sensor of the invention may present several variant embodiments.

Figure 8:
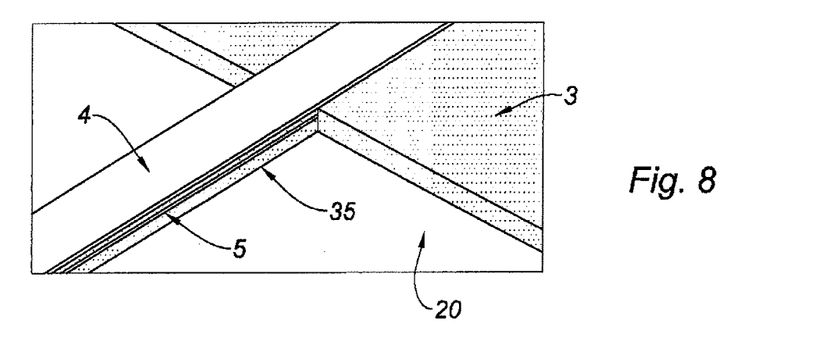
FIG. 8 is a perspective view showing the variant embodiment of the sensor shown in FIGS. 1 to 3.

In the variant shown in FIG. 8, an electrically conductive ribbon 5 is inserted in the strip 35 of the thermally insulating structure 3 that lies under the heater element 4 and between the two bridges 33, 34. The ribbon 5 is thus electrically insulated from the heater element 4.

Under such conditions, the ribbon 5 may be used as a reference measurement resistance making it possible to measure differential temperature directly with the heater element 4. It is then possible to measure the temperature variation of the heater element 4 carrying a constant current directly, without using a Wheatstone bridge outside the sensor.

Taking a measurement is thus simplified compared with the sensor 1 of FIGS. 1 to 3.

In order to fabricate this variant embodiment, additional steps need to be provided between above-mentioned steps a) and b). After depositing a layer of thermally insulating material on the substrate in step a), the ribbon 5 is deposited locally, and then a new layer of thermally insulating material is deposited. Steps b) to d) can then be performed.

The ribbon 5 may be made of silver, aluminum, nickel, tungsten, or platinum.

Figure 9:
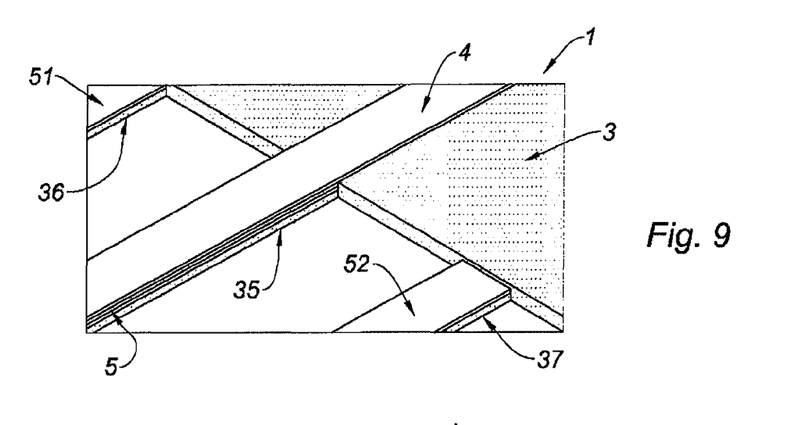
FIG. 9 is a perspective view showing a variant embodiment of the sensor shown in FIG. 8.

In the variant shown in FIG. 9, an electrically conductive ribbon 5 is likewise inserted in the strip 35 of the thermally insulating structure 3 that is situated under the heater element 4 and between the two bridges 33, 34. The ribbon 5 is electrically insulated from the heater element 4 and it may be used as a (reference) measurement resistance. The ribbon 5 may be made of silver, aluminum, nickel, tungsten, or platinum.

This design is similar to that of the variant shown in FIG. 8.

Nevertheless, the thermally insulating structure 3 shown in FIG. 9 also includes two additional strips 36 and 37 connecting together the two bridges 33, 34, which strips are arranged parallel to the heater element 4, and on either side thereof. Furthermore, each of these additional strips 36, 37 is covered in a ribbon 51, 52 of electrically conductive material, similar to the ribbon 5.

These ribbons 51, 52 act as additional measurement resistances. It is thus also possible to measure the magnitude and the direction of a flow speed. In the absence of any flow, both measurement resistances 51, 52 are at the same temperature. In contrast, in the presence of a flow, these two measurement resistances are at different temperatures, and this temperature difference makes it possible to determine the magnitude and the direction of the flow. It is also possible to measure a thermal diffusion constant of the fluid in the cavity.

In order to fabricate the strips 36, 37 covered by the ribbons 51, 52, it suffices either to modify step b), or else to add a step between steps a) and b) or between steps b) and c), for depositing the ribbons 51, 52 of electrically conductive material on the thermally insulating structure 3 deposited in step a). During plasma etching step c), only the thermally insulating structure that is not covered in electrically conductive material is etched.

Figure 10:
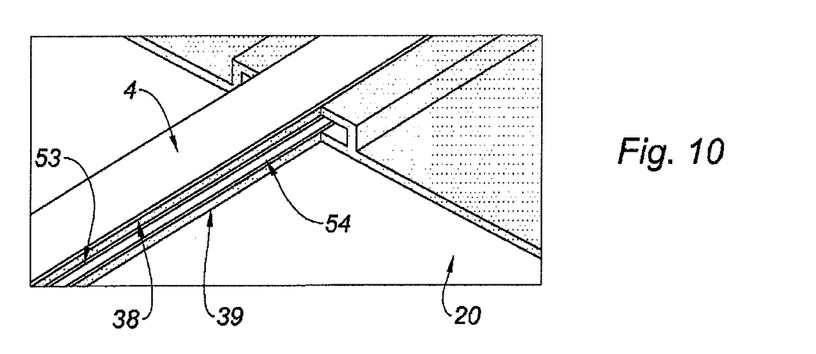
FIG. 10 is a perspective view showing another variant embodiment of the sensor shown in FIGS. 1 to 3.

Another variant of the sensor of the invention is shown in FIG. 10.

In this variant, two electrically conductive ribbons 53, 54 that are separated by a thin strip of air are provided under the heater element 4. The first ribbon 53 is separated from the heater element 4 by a strip 38 forming part of the thermally insulating structure 3, and the second ribbon 54 is supported by another strip 39 likewise forming part of the thermally insulating structure. The strip of air between the two ribbons 53, 54 is a few nanometers thick. The ribbons 53, 54 are thus electrically insulated from the heater element.

Compared with the device described with reference to FIG. 8, this variant embodiment gives access to certain properties of the fluid (conductivity, diffusivity, . . . ) in a rarefied flow.

In order to fabricate this variant embodiment, it is appropriate to perform additional steps between the above-mentioned steps a) and b).

In accordance with step a), a layer of thermally insulating material is deposited on the substrate.

The additional steps are as follows.

The bottom ribbon 54 is deposited locally on the layer of thermally insulating material. Advantageously, but not necessarily, a fine layer of electrically insulating material is then deposited in order to limit any risk of short circuits in the sensor. Thereafter, a sacrificial layer is deposited locally, which layer is eliminated subsequently to form the fine strip of air between the two ribbons 53, 54. Thereafter the top ribbon 53 is deposited on the sacrificial layer. A new layer of electrically insulating material is then deposited, this layer being for supporting the heater element 4.

Once these steps have been performed, above-described steps b) to d) are performed.

Figure 11:
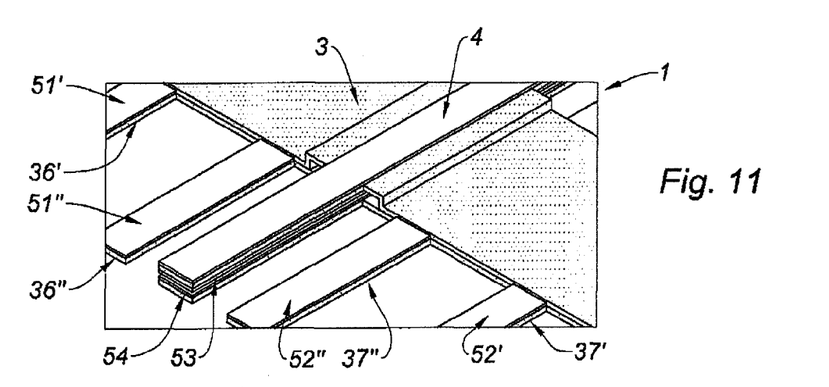
FIG. 11 is a perspective view showing a variant embodiment reusing design elements specific to the variants of FIGS. 9 and 10.

Another variant of a sensor of the invention is shown in FIG. 11.

In this variant, the electrically conductive ribbons 53, 54 separated by a strip of air are provided in similar manner to the variant embodiment described with reference to FIG. 10. Furthermore, a plurality of strips 36', 36", 37', 37" forming part of the thermally insulating structure 3 and each covered by an electrically conductive ribbon 51', 51", 52', 52" are provided in a manner similar to the variant described with reference to FIG. 9.

This variant amounts to a combination of the structure shown in FIGS. 9 and 10. It therefore presents the advantages conferred by the two variants described with reference to FIGS. 9 and 10.

The various variant embodiments of the sensor of the invention as described with reference to FIGS. 8 to 11 make use of one or more measurement resistances in order to simplify taking the measurement compared with the sensor 1 described with reference to FIGS. 1 to 3.

The use of measurement resistances requires the corresponding number of connection circuits with the heater element in order to obtain the desired data.

Measurements may be further improved by using a measuring technique involving surface acoustic waves.

Sensors 10 in accordance with the invention using this technique are described below with reference to FIGS. 12(a), 12(b), 13(a), and 13(b).

Figure 12A:
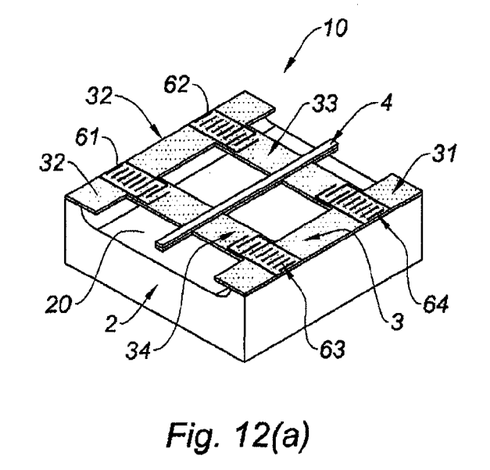
FIGS. 12(a) and 12(b) are perspective views showing other variants of the sensor shown in FIGS. 1 to 3.

A first variant of the sensor 10 taking advantage of this technique is shown in FIG. 12(a).

In this variant, the thermally insulating structure is associated with a piezoelectric material in order to form a structure that is referenced 3'. The structure 3' comprises thermal insulation, a piezoelectric material, and surface acoustic wave delay lines 61, 62, 63, 64 (emitter 61, receiver 63, emitter 62, receiver 64), these delay lines being arranged at each junction between the bridges 33, 34 and the connection zones 31, 32 with the substrate 2.

The characteristic of the sensor is given by varying the resonant frequency of the device as a function of variation in the mechanical properties of the piezoelectric material used, this variation in mechanical properties coming from the variations in temperature to which the sensor is subjected.

A surface acoustic wave can thus be transmitted by each of the transducers 61, 62 having interdigitated electrodes that are arranged along the connection zone 32, to each of the transducers 63, 64 arranged along the connection zone 31.

These interdigitated electrode transducers 62, 64 and 61, 63 then enable the acoustic waves that propagates in the bridge 33, 34 on which the transducers are actually mounted to be generated and detected.

This thus simplifies taking measurements.

Specifically, the measurements are measurements of the mean temperature of each bridge 33, 34. Knowing the reference temperature of the substrate 2, it is then possible to perform a differential temperature measurement in each bridge 33, 34, thus making it possible to work back to the desired data, e.g. a flow speed.

The quality of the measurement is correspondingly improved by the presence of bridges 33, 34 making it possible to perform measurements that are independent from one bridge to the other, thereby reducing measurement noise by an averaging effect. The shape of the sensor is thus particularly well suited to performing a measurement technique using surface acoustic waves for simplifying measurement, and also for improving accuracy.

In order to fabricate this sensor, above-described step a) is performed.

Thereafter, the piezoelectric material is deposited on the thermally insulating layer and the interdigitated electrode transducers on made on the piezoelectric material.

Step b) is performed.

Step c) then consists in etching both the thermal insulation and the piezoelectric material associated therewith, in order to define the shape of the bridges.

The other steps remain unchanged.

It should be observed that the piezoelectric material may be used directly as a thermally insulating layer when its thermal conductivity is low. This applies for example to materials such as polycrystalline structure zinc oxide and aluminum nitride, which have thermal conductivities lying in the range 10 watts per kelvin meter ($W.K^{-1}.m^{-1}$) to 20 $W.K^{-1}.m^{-1}$. Under such circumstances, the piezoelectric material thus forms the thermally insulating structure.

The dimensioning of such resonators form part of the general knowledge of the person skilled in the art and is therefore not described.

The sensor described with reference to FIG. 12(a) may be improved.

Figure 12B:
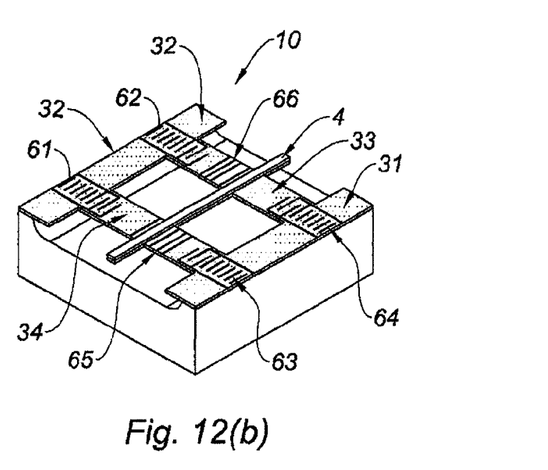

This is proposed by the variant of FIG. 12(b).

This variant uses the characteristics of the sensor shown in FIG. 12(a).

However, each bridge 33, 34 is provided with a respective reflector 65, 66 including a localized defect. This makes it possible to measure the temperature of the bridge locally at the defect. Consequently, compared with the sensor described with reference to FIG. 12(a), temperature is measured in localized manner at the defect. This measurement is based on analyzing the reflection coefficient and not on transmission between transducers.

By way of example, localized temperature measurement at the defect makes it possible to measure the temperature under the heater element, if that is where the defect is situated. Insofar as the temperature is at a maximum at this point, the sensitivity of the sensor is thus maximized compared with a sensor of the kind shown in FIG. 12(a) in which it is an average temperature that is measured. Furthermore, the response time of the sensor is also improved, thereby increasing its bandwidth. The method of fabricating this sensor is similar to the method of fabricating the sensor shown in FIG. 12(a).

Figure 13A:
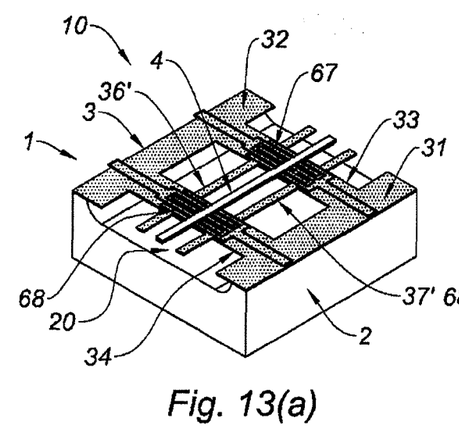
FIGS. 13(a) and 13(b) are perspective views likewise showing other variants of the sensor shown in FIGS. 1 to 3.
Figure 13B:
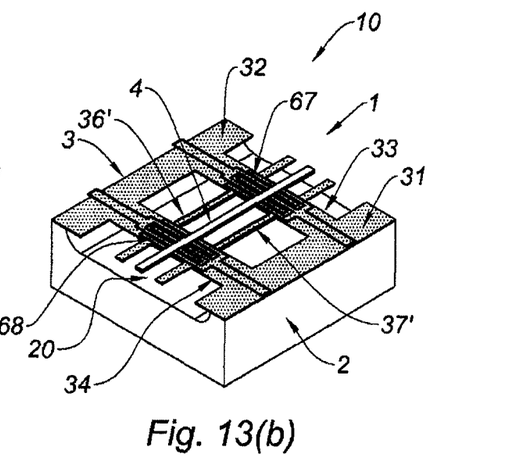

FIGS. 13(a) and 13(b) show other embodiments of a sensor in accordance with the invention and taking advantage of measurement by means of surface acoustic waves.

Once more, the structure 3' comprises thermal insulation and a piezoelectric material. Nevertheless, it has strips 36', 37' that are arranged between two bridges 33, 34 on either side of the heater element 4.

The emitter and receiver transducers 67 and 68 are in the form of interdigitated fingers on each of the bridges 33, 34 of the structure 3'.

This arrangement enables the surface acoustic wave as generated by the transducer 67, for example, to propagate in the strips 36', 37', with the characteristics of the wave being modified by environmental conditions.

It should be observed that the shape of this sensor is close to that of the embodiment of the invention described with reference to FIG. 9.

It thus makes it possible to obtain information of the same type (magnitude and direction of a speed, diffusion constant of the fluid, . . . ) but with measurement being simplified as a result of using the surface acoustic wave measurement technique.

In order to fabricate the sensor, it is appropriate after step a) of depositing the thermally insulating layer on the substrate, to deposit a piezoelectric material on the thermally insulating layer and to fabricate the transducers 67, 68 by deposition on the piezoelectric layer. Advantageously, but not necessarily, a fine electrically insulating layer is then deposited in order to limit any risk of short circuits in the sensor. Thereafter, it is possible to perform step b) after depositing the heater element. Etching step c) then consists in fabricating the bridges 33, 34 and the strips 36', 37' simultaneously. Finally, step d) is performed.

In the variant shown in FIG. 13(b), the sensor reproduces all of the characteristics of the sensor shown in FIG. 13(a) and functionalized strips 36', 37' are also provided in order to obtain a sensor offering additional properties.

Specifically, two electrically conductive lines (not referenced) are arranged on each strip 36', 37', thus making it possible to obtain a filter function.

In the embodiments described with reference to FIGS. 12(a) to 13(b), the thermally insulating structure may be associated with various piezoelectric materials such as aluminum nitride (AlN), zinc oxide (ZnO), or gallium nitride (GaN).

The surface acoustic wave measurement technique may also be used in combination with the Pirani effect, in order to measure pressures of the same order of magnitude as atmospheric pressure (barometric pressure).

Figure 14A:
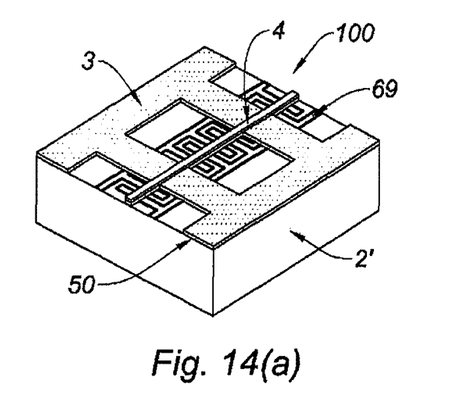
FIGS. 14(a) and 14(b) are further respective views showing variants of the sensor shown in FIG. 6.
Figure 14B:
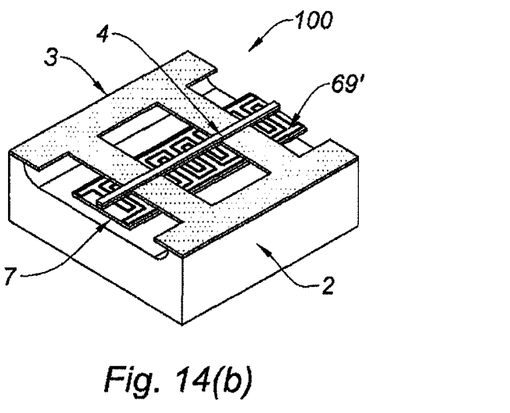

FIGS. 14(a) and 14(b) show two variant embodiments of the sensor of the invention that can be used for this purpose.

In FIG. 14(a), the sensor 100 has a substrate 2' made of a piezoelectric material with an interdigitated electrode transducer 69 arranged on its surface. The transducer 69 is arranged facing the heater element 4 and at a short distance from the thermally insulating structure 3, e.g. lying in the range 100 nm to 500 nm in order to benefit from the Pirani effect.

Under the effect of pressure, the temperature of the heater element 4 is modified. The modification of this temperature modifies the characteristics of the surface wave propagating at the surface of the substrate 2', which modifications are amplified by the resonator 69. Analyzing the surface acoustic wave as modified in this way makes it possible to determine the temperature variation of the heater element 4, and to deduce therefrom the pressure in the cavity 20.

Once more, this variant makes it possible to simplify taking measurements, compared with the sensor 1' described with reference to FIG. 6.

In order to fabricate this sensor, the interdigitated electrode transducer 69 is made initially on the piezoelectric substrate 2'. Thereafter, a sacrificial layer 50 is deposited locally, thus making it possible in step d) to define the cavity. Thereafter, the thermally insulating layer is deposited in accordance with step a), e.g. using $SiO_2$/SiN, and the heater element 4 is deposited in accordance with step b). The thermal insulation is etched anisotropically in accordance with step c) in order to form the bridges, and finally step d) is performed of isotropically etching the sacrificial layer.

The sensor 100 shown in FIG. 14(b) constitutes an improvement to the sensor shown in FIG. 14(a).

In this variant, the substrate 2 is no longer made of a piezoelectric material, but of silicon, for example. The structure is made up of the thermally insulating structure 3 fitted onto a piezoelectric plate 7 that is separated from the substrate. The plate 7 also comprises, on the surface, a transducer 69' that is advantageously identical to the resonator 69 and that is arranged facing the heater element 4. In addition, the plate 7 is arranged in such a manner that the distance between it and the thermally insulating structure lies in the range 100 nm to 500 nm, in order to benefit from the Pirani effect.

The main advantage associated with this variant embodiment compared with the sensor shown in FIG. 14(a) is to provide a better response time, i.e. a greater bandwidth. This is due mainly to reducing the thermal inertia of the sensor associated with using a piezoelectric plate in the form of a thin layer. The plate 7 typically presents thickness lying in the range 500 nm to 4 μm.

In order to fabricate the sensor, a thin piezoelectric layer is initially deposited on the substrate 2, and then the interdigitated electrode transducer is made on the thin layer. Thereafter, a sacrificial layer is deposited on the piezoelectric thin layer, and above-described steps a) to c) are performed, followed by etching the piezoelectric layer in order to define the plate 7. Finally, the method is finished off by performing above-described step d) to etch the sacrificial layer so as to define the cavity.

In another variant embodiment of the invention, it is possible to fabricate a sensor 1 in which no thermally insulating material is present under the heater element 4 between the two bridges 33, 34.

For this purpose, it is appropriate to perform above-described steps a) to b) in the opposite order.

Etching step c) then makes it possible to define bridges 33, 34 of the thermally insulating structure 3 and to eliminate the thermally insulating layer situated over the heater element.

Step d) and the step of depositing electrical contacts are then interchanged.

In this variant, the robustness of the sensor is less than that of the sensor 1 shown in FIG. 1, but its bandwidth is improved.

More generally, the absence of thermally insulating material under the heater element 4 can be envisaged for the variant embodiments described with reference to FIGS. 1 to 3, 6, 12(a), 12(b), 13(a), 13(b), 14(a), and 14(b).

In all of the above-described embodiments of the invention, the sensor 1, 1', 10, 100 is a single cell sensor in which the thermally insulating structure presents only two bridges 33, 34.

Nevertheless, the structure of the sensor makes it possible to use a heater element 4 of length that is not limited, since the thermally insulating structure 3 may include N successive bridges, where N is greater than or equal to 3, in order to ensure its robustness.

Such a sensor may be fabricated using steps a) to d), merely by providing a substrate of suitable length, so as to make a plurality of individual cells of the sensor simultaneously, the cells being in series. Under such circumstances, it suffices to deposit only two electric contacts, at the end of the heater element 4.

Figure 15:
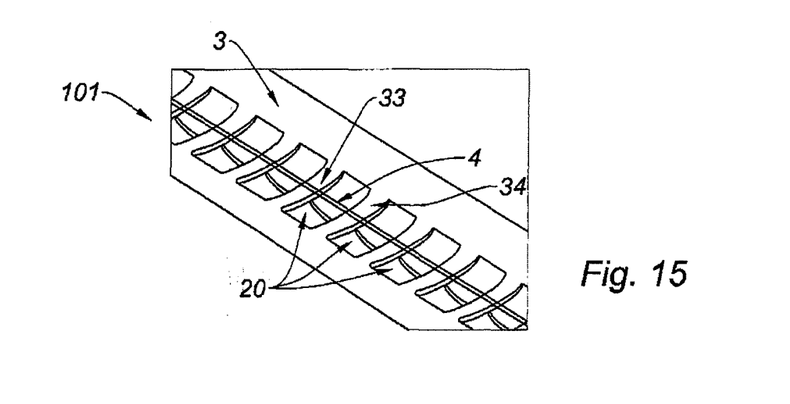
FIG. 15 is a perspective view taken using a scanning electron microscope showing a sensor in accordance with the invention having N individual cells in series, each cell being representative of the sensor shown in FIGS. 1 to 3.

FIG. 15 shows an image of this type of sensor 101 seen in a perspective view, as obtained with a scanning electron microscope.

In FIG. 15, it can be seen that the bridges of the thermally insulating structure are curved. This is associated with the internal stresses in the material. To solve this problem, it is possible either to reduce the thickness of the material forming the thermally insulating layer, or else to provide a stress-compensated multilayer structure, as described above.

An advantage associated with using a sensor having N≥3 individual cells is to make the temperature value along the heater element 4 more uniform by limiting edge effects. This serves to improve the accuracy of the measurement taken.

Furthermore, it is appropriate to observe that the method of fabricating the sensor shown in FIGS. 1 to 3 may be modified in order to fabricate two types of sensor in parallel.

For example, FIGS. 16(a) to 16(d) show the various steps involved in fabricating a double sensor serving both to measure a flow speed and/or a wall shear stress, and also a pressure by the Pirani effect.

To this end, a thin layer of aluminum 6 is locally deposited on the substrate 2, followed by a layer of amorphous silicon of predetermined thickness on the thin layer of aluminum. This produces the structure shown in FIG. 16(a).

Figure 16A:
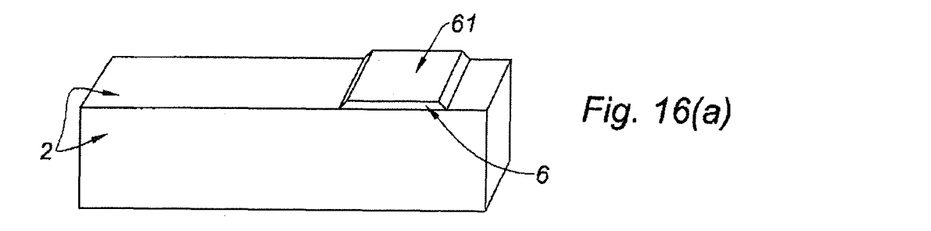
Figure 16B:
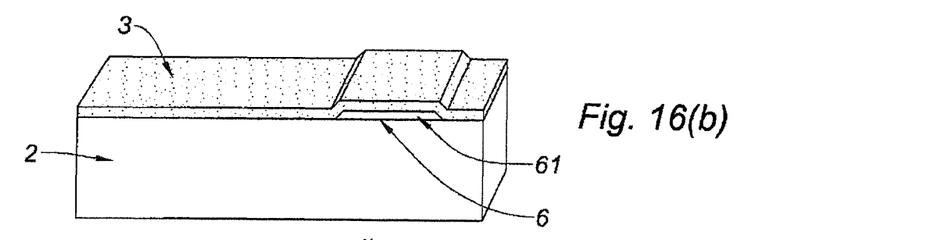
Figure 16C:
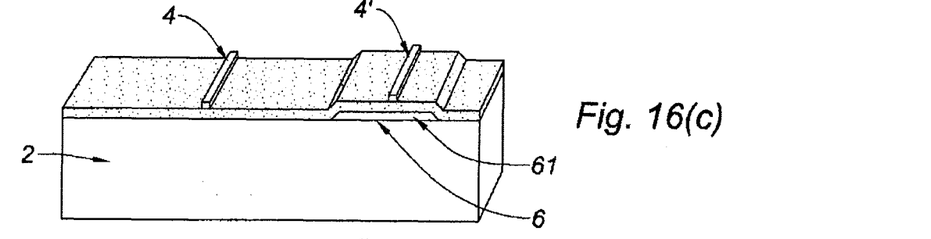
Figure 16E:
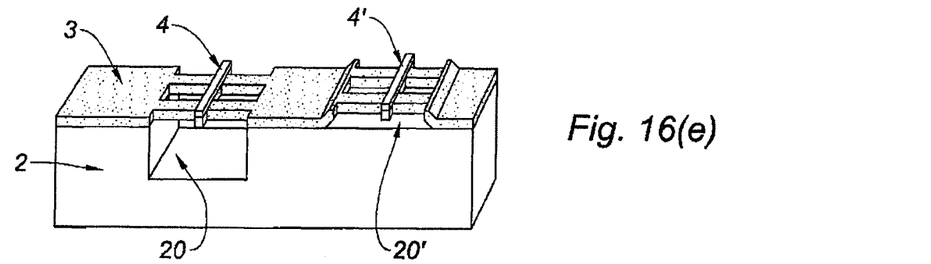

Thereafter, above-described steps a) to d) are performed, each leading respectively to the structures shown in FIGS. 16(b) to 16(d).

In particular, it should be observed that step c) then consists in deposing two heater elements 4 and 4', one for each sensor.

The advantage of the localized deposit of the layer of aluminum coated in a layer of amorphous silicon occurs in step d).

This makes it possible to obtain a cavity 20 of height that is greater than the height of the cavity 20' while performing gaseous chemical etching for an identical period of time. The aluminum layer acts as a stop layer, after eliminating the sacrificial layer of amorphous silicon, so as to ensure that the height of the cavity 20' is accurately controlled, e.g. to have a value of 300 nm, making it possible to obtain the Pirani effect.

It is thus possible to increase the kinds of measurement that can be performed by the sensor.

Naturally, the above-described method relates only to individual cells of a sensor. It is entirely possible to envisage repeating an individual cell N times, both for the pressure sensor and for the speed and/or wall shear friction sensor.

This method is merely an example and the variant embodiments described with reference to FIGS. 6, 8 to 11, 12(a) to 14(b) can likewise be performed in parallel and repeated N times over, for a desired value of N≥3.

This gives great freedom in designing such a sensor.

The invention claimed is:

1. A miniaturized sensor having a heater element and comprising a substrate, a cavity, and a thermally insulating structure suspended over the cavity by connection zones connecting the insulating structure with the substrate, wherein the the thermally insulating structure comprises at least two bridges extending over the cavity between its two connection zones with the substrate, the heater element being supported by the bridges by extending transversely relative to the bridges.

2. A sensor according to claim 1, wherein the length L of a bridge lies in the range 10 μm to 80 μm.

3. A sensor according to claim 1, wherein the width l of a bridge lies in the range 5 μm to 10 μm.

4. A sensor according to claim 1, wherein the distance D between two bridges lies in the range 20 μm to 40 μm.

5. A sensor according to claim 1, wherein the thickness e of the bridges lies in the range 100 nm to 500 nm.

6. A sensor according to claim 1, wherein the height h of the cavity lies in the range 50 nm to 500 μm.

7. A sensor according to claim 1, wherein the width a of the heater element lies in the range 1 μm to 5 μm.

8. A sensor according to claim 1, wherein the thickness b of the heater element lies in the range 50 nm to 500 nm.

9. A sensor according to claim 1, wherein the heater element comprises a plurality of layers of electrically conductive material, one layer being made of a material presenting residual stress in tension and the adjacent layer being made of a material presenting residual stress in compression, the thicknesses of these layers being adapted to compensate for the residual stresses among the various layers in order to obtain a total residual stress for the heater element that is less than a first limit value of 250 MPa.

10. A sensor according to claim 9, wherein the heater element comprises:
a first layer of platinum;
at least one bilayer made up of a layer of nickel coated in a layer of tungsten; and
a second layer of platinum.

11. A sensor according to claim 1, wherein the thermally insulating structure comprises a plurality of layers of thermally insulating material, one layer being made of a thermally insulating material that presents residual stress in tension and the adjacent layer being made of a thermally insulating material that presents residual stress in compression, the thicknesses of the layers of thermally insulating material being adapted to compensate for the residual stresses among the various layers so as to obtain a total residual stress for the structure that is less than a second limit value of 250 MPa.

12. A sensor according to claim 11, wherein the thermally insulating structure comprises at least one bilayer formed by a layer of silicon dioxide and a layer of silicon nitride.

13. A sensor according to claim 1, wherein the thermally insulating structure includes a strip extending under the heater element between the two bridges, said thermally insulating strip incorporating a ribbon made of an electrically conductive material, the ribbon being electrically insulated from the heater element by said strip.

14. A sensor according to claim 1, wherein the thermally insulating structure includes two strips extending under the heater element between the two bridges, two ribbons made of electrically conductive material and separated by a strip of air being deposited between the two strips of the thermally insulating structure, such that the ribbons are electrically insulated from the heater element.

15. A sensor according to claim 1, wherein the thermally insulating structure includes at least two other thermally insulating strips extending between the two bridges on either side of the heater element, each of these two other strips including a ribbon made of an electrically conductive material.

16. A sensor according to claim 1, wherein the at least two bridges of the thermally insulating structure are made of a piezoelectric material deposited on a thermal insulation material, and wherein the sensor includes transducers for surface acoustic waves being mounted on the bridges at each junction between the bridges and the connection zones with the substrate.

17. A sensor according to claim 1, wherein the substrate is made of a piezoelectric material, and a surface acoustic wave resonator is deposited on the substrate, at the bottom of the cavity.

18. A sensor according to claim 1, wherein a plate of piezoelectric material is provided on the bottom of the cavity, said plate being provided on its surface with a surface acoustic wave resonator.

19. A sensor according to claim 1, wherein the thermally insulating structure has N bridges on which the heater element is deposited, where N is greater than or equal to three.

20. A method of fabricating a sensor according to claim 1, the method comprising the following steps:
 a) depositing at least one layer of thermally insulating material on a substrate;
 b) depositing at least one element made of an electrically conductive material on said at least one layer of thermally insulating material, said element being configured to form a heater element;
 c) subjecting the structure obtained in step b) to plasma etching in order to define the shape of the thermally insulating structure with at least two bridges extending between two connection zones connecting said thermally insulating structure with the substrate; and
 d) performing gaseous chemical etching to define the cavity of the substrate over which the thermally insulating structure extends.

21. A method according to claim 20, wherein prior to step a), there is provided a step of locally depositing a top layer on the substrate followed by a step of depositing a sacrificial layer of predetermined thickness on the top layer.

22. A method according to claim 20, wherein step b) consists in depositing a plurality of electrically conductive material layers in succession, one layer being made of a material presenting residual stress in tension and the adjacent layer being made of a material presenting residual stress in compression, the thicknesses of these layers of insulating material being adapted to compensate the residual stresses among the various layers in order to obtain a total residual stress for the element that is less than a first limit value of 250 MPa.

23. A method according to claim 20, wherein step a) consists in depositing a plurality of layers of thermally insulating material in succession, one layer being made of a material presenting residual stress in tension and the adjacent layer being made of a material presenting residual stress in compression, the thickness of these layers of insulating material being adapted to compensate the residual stresses among the various layers so as to obtain a total residual stress for the thermally insulating structure that is less than a second limit value of 250 MPa.

\* \* \* \* \*